United States Patent
Liu et al.

(10) Patent No.: US 7,759,245 B2
(45) Date of Patent: Jul. 20, 2010

(54) SEMICONDUCTOR DEVICE FABRICATING METHOD

(75) Inventors: Yun-Sheng Liu, Hsinchu (TW);
Wen-Chung Chen, Changhua County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 298 days.

(21) Appl. No.: 11/948,932

(22) Filed: Nov. 30, 2007

(65) Prior Publication Data
US 2009/0142918 A1 Jun. 4, 2009

(51) Int. Cl.
*H01L 21/4763* (2006.01)

(52) U.S. Cl. .............................. 438/627; 257/E21.584; 257/E21.495

(58) Field of Classification Search ................. 438/627; 257/E21.584, E23.141, E21.169, E21.495, 257/E21.575, E21.585
See application file for complete search history.

(56) References Cited

U.S. PATENT DOCUMENTS

| 6,873,019 | B2 * | 3/2005 | Ida et al. ...................... 257/382 |
| 2006/0068551 | A1 * | 3/2006 | Bloom ........................ 438/275 |

* cited by examiner

*Primary Examiner*—Walter L Lindsay, Jr.
(74) *Attorney, Agent, or Firm*—Quintero Law Office

(57) ABSTRACT

A semiconductor device fabricating method is described. The semiconductor device fabricating method comprises providing a substrate with a logic device region and a memory device region. A logic device with a first silicide region and a first silicide block region and a memory device with a second silicide region and a second silicide block region are formed in the logic device region and the memory device region, respectively. A first insulating layer is formed covering the first and second silicide block regions. A silicide process is performed to form a silicide layer on the first and second silicide regions. An underlying second insulating layer and an insulating barrier layer are formed covering the first insulating layer and the silicide layer.

10 Claims, 5 Drawing Sheets

SEMICONDUCTOR DEVICE FABRICATING METHOD

BACKGROUND OF THE INVENTION

1. Field of the Invention

The invention relates to a semiconductor device fabricating method, and more particularly to a contact hole fabricating process of a semiconductor device.

2. Description of the Related Art

System-on-a-chip (SoC) designs have become mainstream designs of integrated circuits due to improving semiconductor device scaling processes and critical requirements for dimensions and functions of consumer products. System-on-a-chip (SoC) is a technology that packages of all necessary electronic devices and circuitry, such as, logic devices, memory devices or input/output (I/O) interfaces, for a complete "system" on a single integrated circuit (IC). For example, an SoC fabricating process of a liquid crystal display (LCD) is needed for integrating high voltage (such as, 30 or 40V) metal oxide semiconductor transistors (HVMOS), low voltage or medium voltage (such as, 2.5 or 5V) logic circuits, or non-volatile memory devices in one chip. Therefore, processes integration of high voltage devices, low voltage or medium voltage devices with improving device reliability has become an important challenge due to different device breakdown voltages for each SoC device.

A novel semiconductor device fabricating method integrating different devices is desirable.

BRIEF SUMMARY OF INVENTION

The invention provides a semiconductor device fabricating method. An exemplary embodiment of a method for fabricating a semiconductor device comprising providing a substrate with a logic device region and a memory device region, forming a logic device and a memory device in the logic device region and the memory device region respectively, wherein the logic device has a first silicide region and a first silicide block region, and the memory device has a second silicide region and a second silicide block region, forming a first insulating layer covering the first and second silicide block regions, performing a silicide process to form a silicide layer on the first and second silicide regions, forming an lower second insulating layer and an upper insulating barrier layer covering the first insulating layer and the silicide layer.

Another exemplary embodiment of a method for fabricating a semiconductor device comprises providing a substrate with a logic device region and a memory device region, forming a logic device and a memory device in the logic device region and the memory device region respectively, wherein the logic device has a first silicide region and a first silicide block region, and the memory device has a second silicide region and a second silicide block region, forming a first insulating layer covering the first and second silicide block regions, performing a silicide process to form a silicide layer on the first and second silicide regions, forming an lower second insulating layer and an upper insulating barrier layer covering the first insulating layer and the silicide layer, blanketly forming a dielectric layer covering the insulating barrier layer, performing an anisotropic etching to form a plurality of via holes by removing a portion of the first insulating layer, the insulating barrier layer and the dielectric layer, which are formed on the first and second silicide block regions, and removing a portion of the second insulating layer, the insulating barrier layer and the dielectric layer, which are formed on the silicide layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
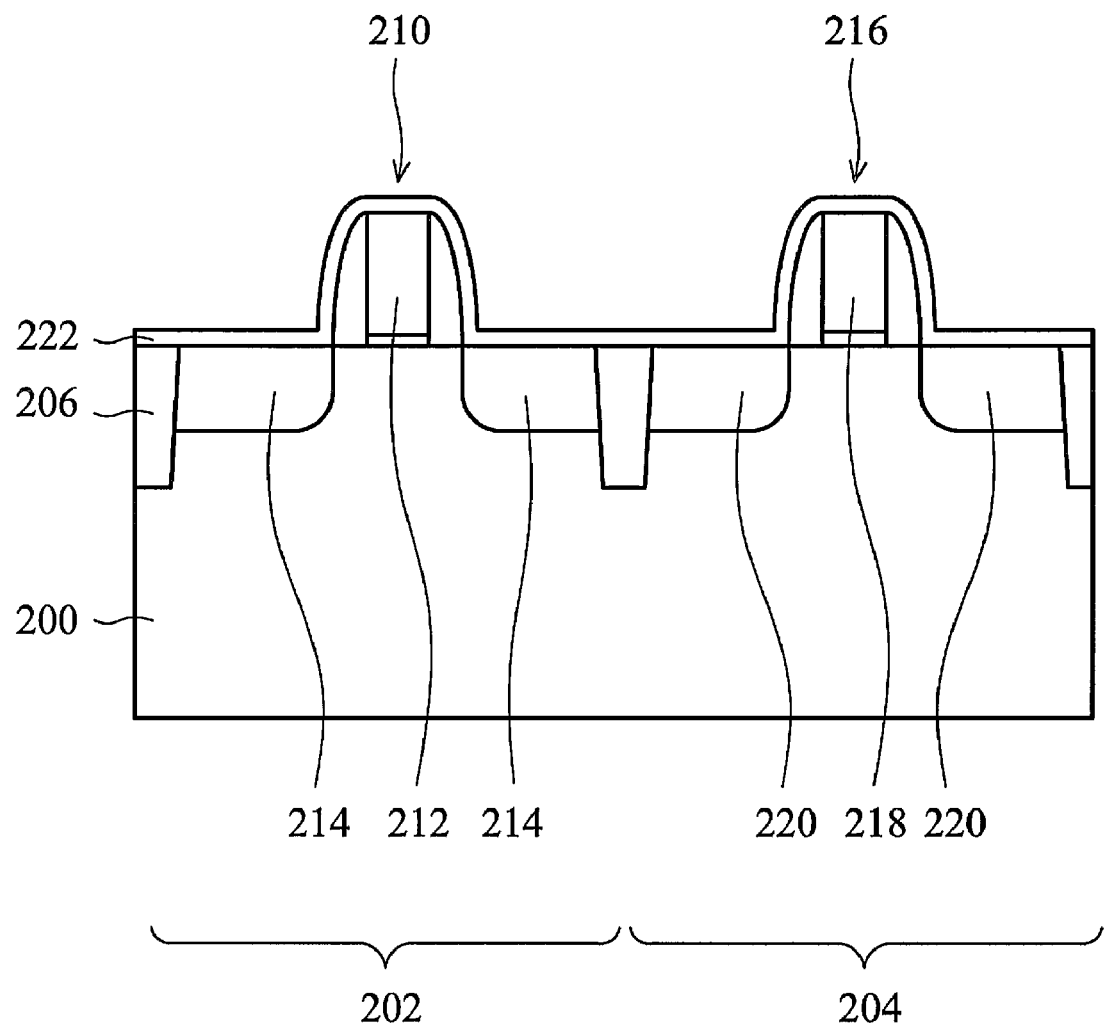
FIGS. 1 to 5 show cross sections of an exemplary embodiment of a semiconductor device of the invention.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1 to 5 show cross sections of an exemplary embodiment of a semiconductor device of the invention. Wherever possible, the same reference numbers are used in the drawings and the descriptions of the same or like parts.

FIG. 1 illustrates a cross section of an exemplary embodiment of a semiconductor device of the invention. A substrate 200 is provided. The substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type impurities. A plurality of shallow trench isolations (STIs) 206 may be formed in the substrate 200 to define two regions, a logic device region 202 and a memory device region 204. Next, a logic device 210 and a memory device 216 are formed in the logic device region 202 and the memory device region 204, respectively. The logic device 210 may comprise N-type metal-oxide-semiconductor field-effect transistors (NMOS), P-type metal-oxide-semiconductor field-effect transistors (PMOS), complementary metal-oxide-semiconductor field-effect transistors (CMOS), bipolar-CMOS-DMOS (double-diffused MOS) (BCD), diodes, bipolar junction transistors (BJT), resistors, capacitors or inductors. The memory device 216 may comprise a non-volatile memory device such as a one time programming non-volatile memory (OTP) device. As shown in FIG. 1, in one embodiment of the invention, the logic device 210 may be a high-voltage semiconductor device, such as, a BCD device having a gate 212 and source/drain regions 214. The memory device 216 may be an OTP device. Similarly, the memory device 216 may have a gate 218 and source/drain regions 220.

Next, a first insulating layer 222 is conformably formed on the substrate 200, covering the logic device 210 and the memory device 216. The first insulating layer 222 may be formed by a thin film deposition process, such as, chemical vapor deposition (CVD). The first insulating layer 222 may comprise silicon dioxide ($SiO_2$).

Figure 2:
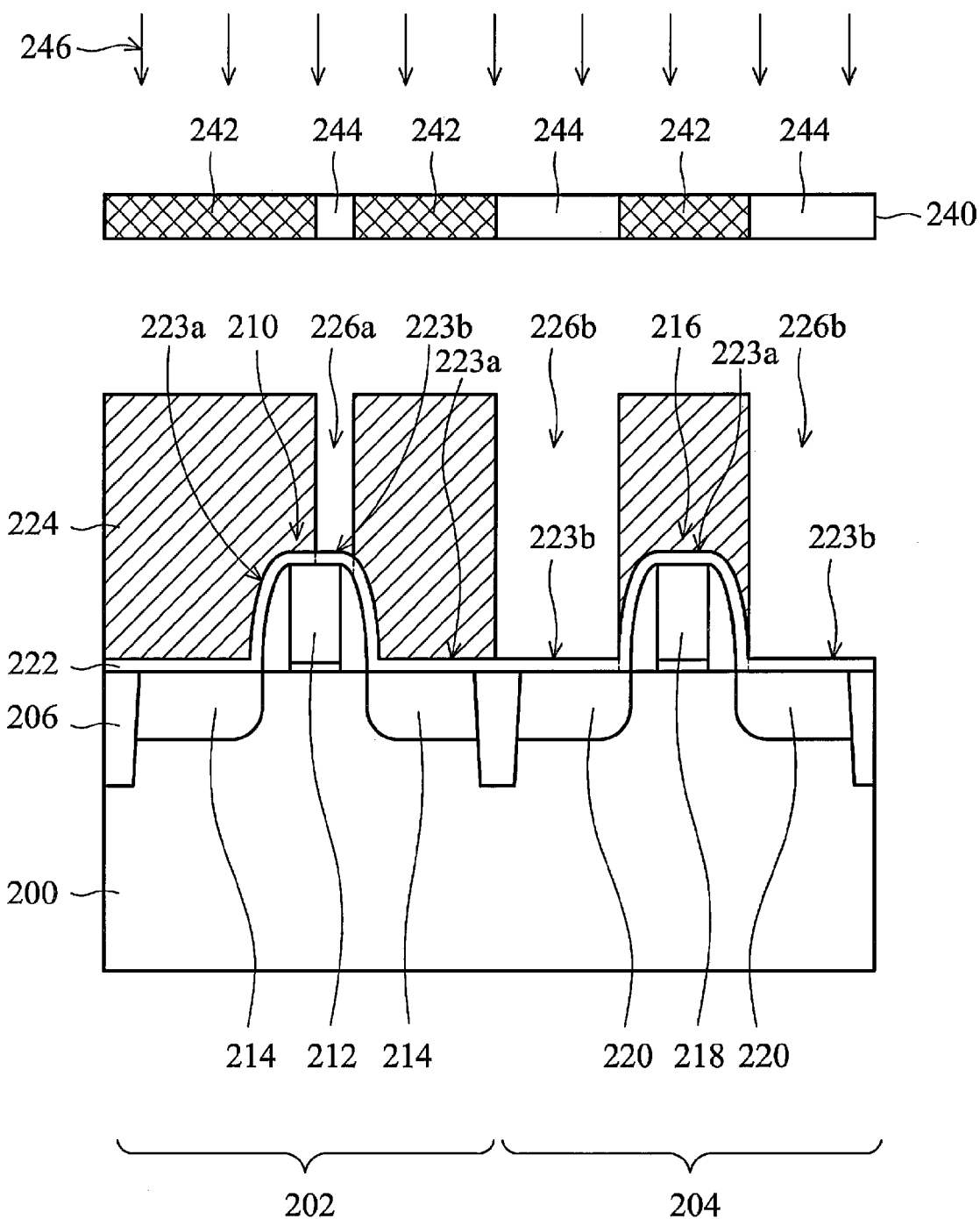

FIG. 2 illustrates formations of openings 226a and 226b. A photoresist layer 224 is blanketly formed covering the first insulating layer 222. Next, a mask layer 240 having a plurality of opaque regions 242 and transparent regions 244 is used to perform a photolithography process 246. The photolithography process 246 is performed to form the opening 226a through the photoresist layer 224 on the logic device region 202, and the opening 226b through the photoresist layer 224 on the memory device region 204. A portion of the first insulating layer 222 is exposed through the openings 226a and 226b. The openings 226a and 226b define the positions of silicide regions 223b on the logic device region 202 and the memory device region 204, respectively. The resulting photoresist layer 224 covers silicide block regions 223a on the logic device region 202 and the memory device region 204, respectively.

Figure 3:
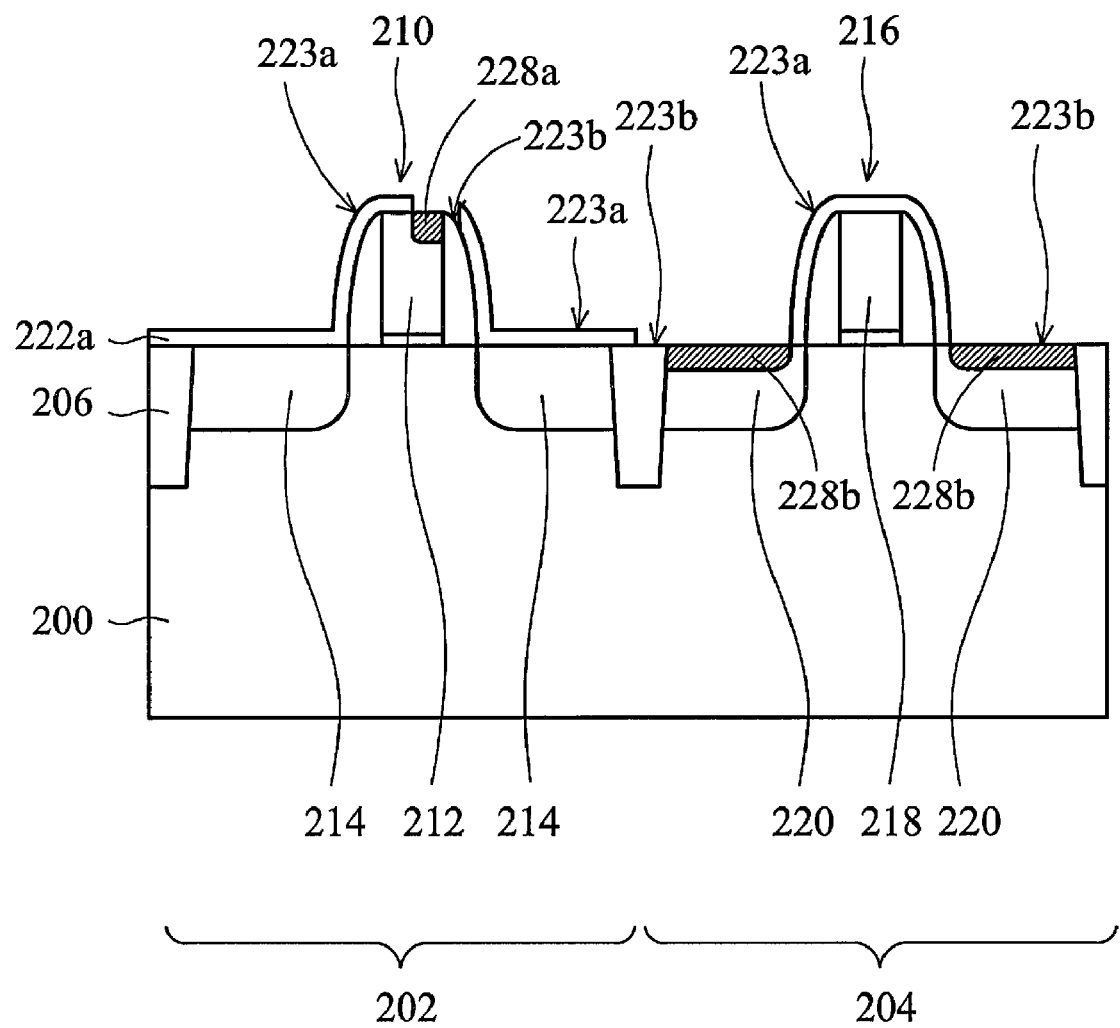

FIG. 3 illustrates formations of silicide layers 228a and 228b. A portion of the first insulating layer 222 not covered by the photoresist layer 224 is removed to form a first insulating layer 222a by an anisotropic etching process. The photoresist layer 224 as shown in FIG. 2 is then removed. A silicidation process is performed to form silicide layers 228a and 228b on the silicide regions 223b not covered by the first insulating layer 222a. A thin metal layer comprising tungsten (W), cobalt (Co), or titanium (Ti) may be blankety formed by a deposition process, such as, physical vapor deposition (PVD). Next, an annealing process, such as, rapid thermal annealing (RTA), may be performed in a furnace with a high-purity atmosphere gas comprising nitrogen or argon. The thin metal layer on an interface between the thin metal layer and the silicon-comprising gate 212 on the logic device region 202 is next reacted with the gate 212 to form the silicide layer 228a, such as, gate silicide layer 228a, and self-aligned on the gate 212. At the same time, the thin metal layer on an interface between the thin metal layer and the source/drain region 220 on the memory device region 204 is reacted with the source/drain 220 to form the silicide layer 228b, such as, source/drain silicide layer 228b, and self-aligned on the source/drain region 220. Finally, the thin metal layer not reacted with the gate 212 on the logic device region 202, or the source/drain region 220 on the memory device region 204 is removed. The silicide layers 228a and 228b may comprise $WSi_x$, $CoSi_x$ or $TiSi_x$, which may reduce an interface resistance of the gate 212 or the source/drain region 220. The first insulating layer 222a may serve as a resistor protect oxide (RPO) layer. A RPO layer is used to block silicide forbidden regions, such as, silicide block region 223a, to prevent subsequence silicide to be formed thereon, thus maintaining electrical performances. In one embodiment of the invention, the first insulating layer 222a covers the source/drain region 214 on the logic device 210 and the gate 218 on the memory device 216.

Figure 4:
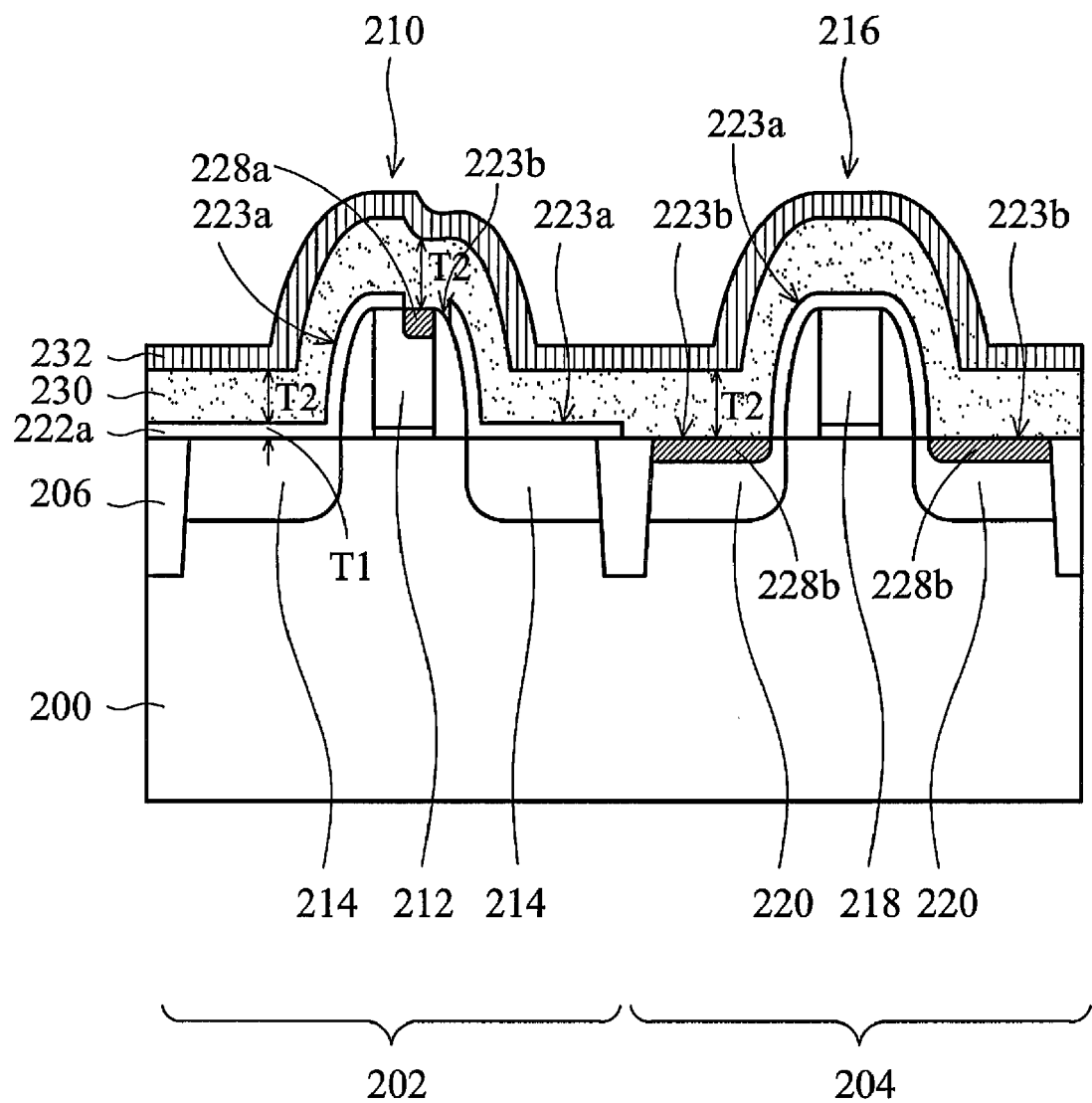

Next, as shown in FIG. 4, a lower second insulating layer 230 and an upper insulating barrier layer 232 are blankety formed covering the first insulating layer 222a and the silicide layers 228a and 228b. The second insulating layer 230 and the insulating barrier layer 232 may be formed on the first insulating layer 222a and the silicide layers 228a and 228b in sequence by a thin film deposition process, such as, chemical vapor deposition (CVD). The second insulating layer 230 may comprise silicon dioxide ($SiO_2$). The insulating barrier layer 232 may comprise silicon nitride ($Si_3N_4$) or silicon oxynitride (SiON). The first insulating layer 222a and the second insulating layer 230 may comprise the same materials, and a thickness $T_2$ of the second insulating layer 230 may be larger than a thickness $T_1$ of the first insulating layer 222a. In one embodiment of the invention, the second insulating layer 230 and the insulating barrier layer 232 may avoid mobile ions induced in the memory device 216 following subsequence metallization processes, wherein if not avoided, the data storage status may be changed and data retention of the memory device 216 may be effected. As shown in FIG. 4, the silicide block region 223a is covered by the first insulating layer 222a and the second insulating layer 230, which comprise $SiO_2$. The silicide region 223b is only covered by the second insulating layer 230. The difference in insulating layer thickness between the silicide block region 223a and the silicide region 223b is the thickness $T_1$ of the first insulating layer 222a. In one embodiment of the invention, the difference in insulating layer thickness between the silicide block region 223a and the silicide region 223b may be between 50 to 250 Å, more preferably 100 to 200 Å, by properly controlling the thickness $T_1$ of the first insulating layer 222a.

Figure 5:
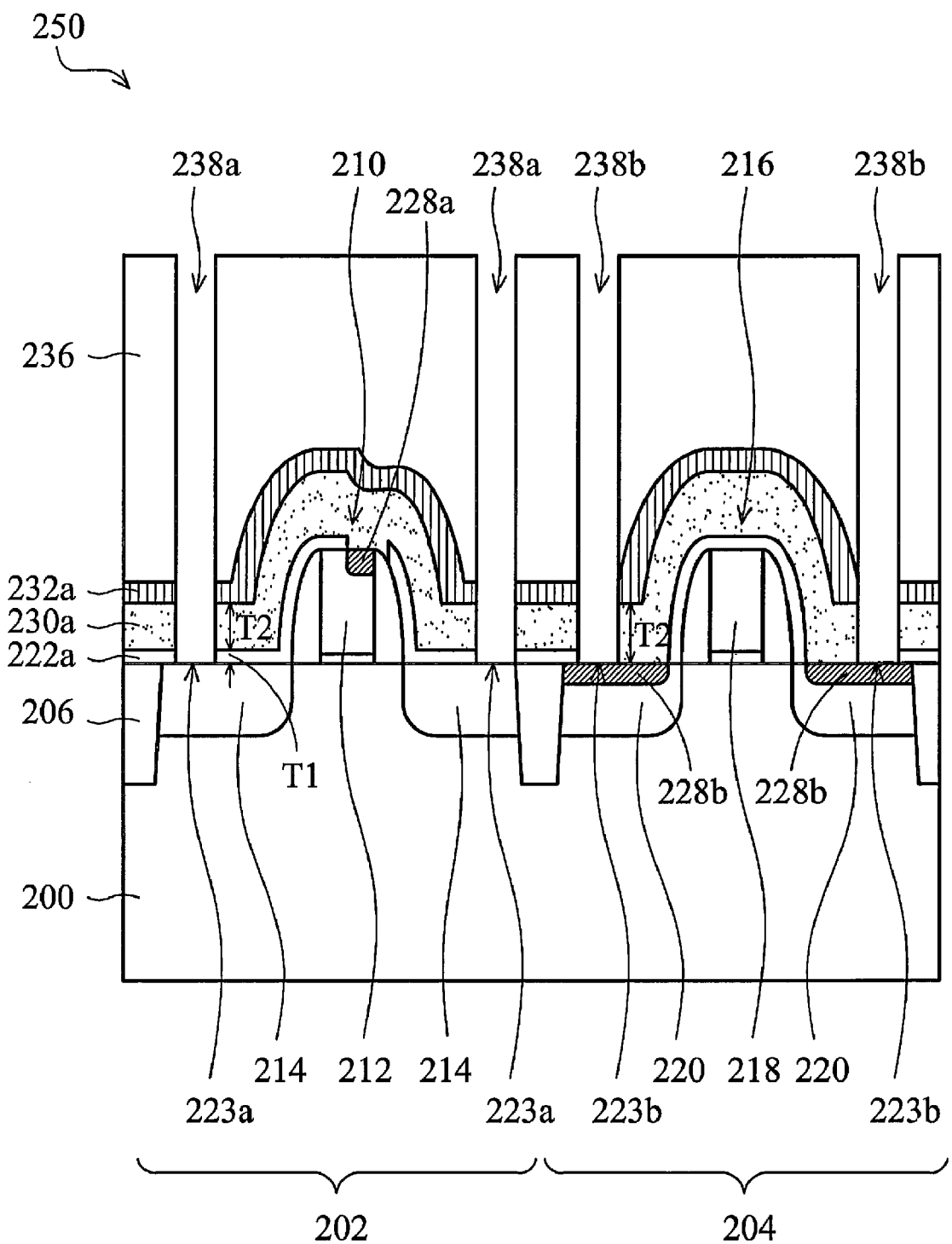

FIG. 5 illustrates formations of the contact holes 238a and 238b. A dielectric layer 236 is blankety formed with a subsequence planarization process, such as, chemical mechanical polishing (CMP), to planarize a surface of the dielectric layer 236. Next, a patterned photoresist layer (not shown) is used to cover the dielectric layer 236 and define positions of contact holes 238a and 238b. An anisotropic etching process is performed to remove a portion of the dielectric layer 236 not covered by the patterned photoresist layer until the insulating barrier layer 232 is exposed. Next, an over-etching process is performed to remove a portion of the first insulating layer 222a, the second insulating layer 230 and the insulating barrier layer 232, which are formed on the first the second silicide block regions 223a and 225a. The over-etching process also removes a portion of the second insulating layer 230 and the insulating barrier layer 232, which are directly on the silicide layers 228a and 228b. The patterned photoresist layer is then removed to form the contact holes 238a and 238b. The silicide layers 228b, which are formed on source/drain region 214 of the logic device 210 and the source/drain region 220 of the logic device 216, are exposed. The dielectric layer 236 may be formed by chemical vapor deposition (CVD) or spin-on coating. The dielectric layer 236 may comprise a low-k material with a dielectric constant (k) of less than 4, for example, undoped silicate glass (USG), phosphorus silicate glass (PSG), fluorinated silicate glass (FSG), boron phosphorus silicate glass (BPSG), fluorine-doped tetraethyl orthosilicate (FTEOS) or hydrogen silsesquioxane (HSQ). Thus, an exemplary embodiment of a semiconductor device 250 of the invention is completely formed.

In an exemplary embodiment of the semiconductor device 250, the first insulating layer 222a is formed on the silicide block region 223a. After forming the first insulating layer 222a, the thicker second insulating layer 230 is blankety formed on the silicide block region 223a and the silicide region 223b. During the etching process of fabricating the contact holes 238a on the silicide block region 223a and the contact holes 238b on the silicide region 223b, the difference in etching thickness of the insulating layers, for example, $SiO_2$ layers, which are on the silicide block region 223a and the silicide region 223b respectively, is the thickness $T_1$ of the first insulating layer 222a. The difference in insulating layer thickness between the silicide block region 223a and the silicide region 223b is well controlled between 50 to 250 Å. In embodiments of the invention, fabricating problems, for example, a contact open problem on the silicide block region 223a due to an overly large difference in insulating layer thickness between the silicide block region 223a and the silicide region 223b, or a silicide layer 238b penetration problem due to over-etching on the silicide region 223b of the insulating layer, will not occur.

An exemplary embodiment of the semiconductor device 250 comprising a logic device 214 and a memory device 216 uses a first insulating layer 222a to cover regions not allowed to form silicide thereon, such as, silicide block regions 223a on the logic device 214 or the memory device 216. A second insulating layer 230a is used to cover the memory device 216 to avoid mobile ions induced in the memory device 216 following subsequence metallization processes, wherein if not avoided, the data storage status may be changed and data retention of the memory device 216 may be effected. The thicknesses of the $SiO_2$ insulating layers, which are directly on the silicide regions or the silicide block regions of the logic device or the memory device, can be precisely controlled to integrate fabricating processes of different devices in one chip without device reliability reducing problems.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a substrate with a logic device region and a memory device region;
   forming a logic device and a memory device in the logic device region and the memory device region respectively, wherein the logic device has a first silicide region and a first silicide block region, and the memory device has a second silicide region and a second silicide block region;
   forming a first insulating layer covering the first and second silicide block regions;
   performing a silicide process to form a silicide layer on the first and second silicide regions; and
   forming a lower second insulating layer and an upper insulating barrier layer covering the first insulating layer and the silicide layer, wherein the second silicide region is located at a source/drain region of the memory device.

2. The method for fabricating the semiconductor device as claimed in claim 1, further comprising:
   blanketly forming a dielectric layer covering the upper insulating barrier layer; and
   performing an anisotropic etching to form a plurality of contact holes by removing a portion of the first insulating layer, the upper insulating barrier layer and the dielectric layer, which are formed on the first and the second silicide block regions, and removing a portion of the second insulating layer, the insulating barrier layer and the dielectric layer, which are formed on the silicide layer.

3. The method for fabricating the semiconductor device as claimed in claim 1, wherein a thickness of the second insulating layer is larger than that of the first insulating layer.

4. The method for fabricating the semiconductor device as claimed in claim 3, wherein the difference in thickness between the first insulating layer and the second insulating layer is between 50Å to 250Å.

5. The method for fabricating the semiconductor device as claimed in claim 1, wherein the first insulating layer and the second insulating layer comprise the same materials.

6. The method for fabricating the semiconductor device as claimed in claim 1, wherein the first insulating layer or the second insulating layer comprises silicon dioxide ($SiO_2$).

7. The method for fabricating the semiconductor device as claimed in claim 1, wherein the insulating barrier layer comprises silicon nitride or silicon oxynitride (SiON).

8. The method for fabricating the semiconductor device as claimed in claim 1, wherein the logic device comprises N-type metal-oxide-semiconductor field-effect transistor (NMOS), P-type metal-oxide-semiconductor field-effect transistor (PMOS), complementary metal-oxide-semiconductor field-effect transistor (CMOS), bipolar-CMOS-DMOS(double-diffused MOS) (BCD), diode, bipolar junction transistor (BJT), resistor, capacitor or inductor.

9. The method for fabricating the semiconductor device as claimed in claim 1, wherein the memory device comprises a one time programming non-volatile memory (OTP) device.

10. The method for fabricating the semiconductor device as claimed in claim 1, wherein the first silicide region is located at a gate of the logic device.

* * * * *